US006877458B2

(12) United States Patent
Ozaki et al.

(10) Patent No.: US 6,877,458 B2
(45) Date of Patent: Apr. 12, 2005

(54) APPARATUS FOR FORMING DEPOSITED FILM

(75) Inventors: Hiroyuki Ozaki, Kyotanabe (JP); Shotaro Okabe, Nara (JP); Masahiro Kanai, Tokyo (JP); Yuzo Koda, Kyotanabe (JP); Tadashi Hori, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/797,566

(22) Filed: Mar. 5, 2001

(65) Prior Publication Data
US 2001/0039924 A1 Nov. 15, 2001

(30) Foreign Application Priority Data
Mar. 6, 2000  (JP) .......................................... 2000-060717
Feb. 28, 2001 (JP) .......................................... 2001-053364

(51) Int. Cl.[7] .............................................. C23C 16/00
(52) U.S. Cl. ................................... 118/723 E; 118/715
(58) Field of Search ...................... 118/723 E, 723 CN, 118/715, 723 MW, 723 I, 723 AN; 156/345.43, 345.47, 345.29

(56) References Cited
U.S. PATENT DOCUMENTS 4,400,409 A      8/1983  Izu et al. ......................... 427/39
4,479,369 A  * 10/1984  Sando et al. .................... 68/5 C
4,841,908 A  *  6/1989  Jacobson et al. ............. 118/718
4,883,560 A  * 11/1989  Ishihara ....................... 118/50.1
4,969,416 A  * 11/1990  Schumaker et al. ........... 117/98
4,998,968 A  *  3/1991  Misumi ..................... 118/723 E
5,266,116 A  * 11/1993  Fujioka et al. ............... 118/718
5,468,521 A     11/1995  Kanai et al. ................. 427/575
5,575,855 A     11/1996  Kanai et al. ................. 118/718
5,792,272 A  *  8/1998  van Os et al. ............. 118/723 I
5,948,704 A  *  9/1999  Benjamin et al. ........ 118/723 R
6,380,684 B1 *  4/2002  Li et al. .................... 118/723 E

FOREIGN PATENT DOCUMENTS

JP          11-251612      *  9/1999

* cited by examiner

Primary Examiner—Luz Alejandro-Mulero
(74) Attorney, Agent, or Firm—Fitzpatrick, Cella, Harper & Scinto

(57) ABSTRACT

To provide an apparatus for forming a deposited film, which is a parallel plate electrode type CVD apparatus, with a discharge vessel receiving a material gas flowing therein and discharging air therefrom, decomposing the material gas by the aid of a plasma generated therein, and depositing the film on the substrate, in which the exhaust port of the material gas exhaust means has an opening wider in the lateral direction than the parallel plate electrode. This structure diminishes the stagnant region of the material gas during the deposited film forming process and controls formation of by-products, to deposit the film uniform in quality and thickness.

7 Claims, 4 Drawing Sheets

APPARATUS FOR FORMING DEPOSITED FILM

BACKGROUND OF THE INVENTION

1. Field of the Invention

The present invention relates to an apparatus for forming a deposited film which forms, on a substrate, a deposited film functional and useful for various devices, e.g., semiconductor device, image-inputting line sensor, photographing device, and electrophotographic photosensitive member, more particularly an apparatus for continuously forming a semiconductor device composed of a thin film of large area, e.g., photoelectromotive device, on a long, band-shaped substrate.

2. Related Background Art

One of the apparatuses for forming a deposited film, which continuously forms thin films on a substrate, is based on continuous plasma CVD method using a roll-to-roll method, as disclosed by U.S. Pat. No. 4,400,409 specification. This apparatus includes two or more glow discharge regions, in which sufficiently long, band-shaped substrates of given width are arranged in a route along which they pass the glow discharge regions orderly, and continuously transfers these substrates in the longitudinal direction while depositing a required electroconductive semiconductor layer in each glow discharge region, to continuously form a large-area device with semiconductor joints. It is considered that these characteristics make the roll-to-roll method suitable for mass production of large-area semiconductor devices.

One of the major problems the above apparatus should solve is controlling deposition of the film for each semiconductor layer to have a uniform thickness, when the semiconductor-joined devices having functional deposited films of different composition, e.g., solar cells, are to be massively produced, because the band-shaped substrates passing over each semiconductor layer is transferred at a constant speed. The CVD method for such an apparatus widely uses RF discharge as means for exciting a glow discharge plasma for decomposing the material gas and forming the deposited film, which tends to cause significant dispersion of film thickness and quality, resulting from increased flow rates of material gas, increased power input, and also increased area of parallel plate electrode. These problems will greatly aggravate the above-described problems involved in the apparatus working based on continuous plasma CVD method using the roll-to-roll method, because they tend to adversely affect film thickness and quality when the band-shaped substrate transferring speed is changed, and also form undesirable by-products, e.g., polysilane, which may deteriorate the deposited film.

The apparatus which uses the roll-to-roll method for forming the deposited film generally includes a number of discharge vessels, to secure desired thickness of the deposited film by continuously transferring the band-shaped substrate in the longitudinal direction.

The apparatus for forming the deposited film, based on continuous plasma CVD method using the conventional roll-to-roll method, is considered to be suitable for mass production of the semiconductor devices of large area.

However, in terms of mass production of the apparatus for forming the deposited film which adopts the plasma CVD method using the roll-to-roll method, it is essential to increase rate at which the band-shaped substrate is transferred. For example, for the mass production, it is necessary to sufficiently increase number of the discharge vessels to secure a desired thickness for each semiconductor layer, in order to increase the transferring rate, because rate of film deposition in each discharge vessel is limited. This tends to increase size, complexity and cost of the apparatus.

The improved productivity is a major problem for the above apparatus to solve for the mass production. This inevitably involves increased rate at which the film is deposited, and extension and increased number of the discharge vessels, leading to increased size, complexity and cost of the apparatus. In particular, the increased size of the discharge space causes the various problems, described below.

The deposited film produced in each discharge vessel is affected by various conditions, e.g., type of discharge energy for generating the plasma, discharge conditions, and composition, flow rate, flow velocity (exhaust velocity) and pressure of the material gas in the vacuum vessel. When the deposited film is continuously produced, in particular, dispersion of the flow velocity (exhaust velocity) of the material gas, resulting from by the viscous effect of the side walls in the vacuum vessel, causes its stagnation of the material gas, which, in turn, causes formation of by-products in the deposited film forming and gas exhausting spaces, to possibly deteriorate the deposited film.

Moreover, the by-products formed in the deposited film forming and gas exhausting spaces may be deposited on the parallel plate electrode and exhaust port, further aggravating dispersion of the material gas flow velocity (exhaust velocity), which, in turn, further aggravates dispersion of the deposited film quality and thickness. Dispersion of the deposited film thickness and quality, and deposition of the film on an undesired site on the band-shaped substrate in each discharge vessel are serious problems, particularly for the deposited film forming method in which the film is deposited over a large area on the continuously transferred band-shaped substrate.

SUMMARY OF THE INVENTION

It is an object of the present invention to provide an apparatus for forming a deposited film, free of the problems involved in the conventional one, which can form the film of uniform quality and thickness, while preventing formation of the stagnant region of the material gas and by-products.

The present invention provides the apparatus for forming a deposited film which has the following structures (1) to (6) to achieve the object.

(1) An apparatus for forming a deposited film, comprising a discharge vessel in a vacuum vessel, the discharge vessel comprising a parallel plate electrode, material gas supply means and material gas exhaust means, having side walls at least one of which is composed of a substrate on which the film is deposited, wherein the material gas is introduced into the discharge vessel while exhausting inside of the discharge vessel and plasma is generated in the discharge vessel, thereby decomposing the material gas to form the deposited film on the substrate, wherein an exhaust port of the material gas exhaust means has an opening wider in the lateral direction than the parallel plate electrode.

(2) The apparatus for forming a deposited film according to (1), wherein the exhaust port has an opening wider in the longitudinal direction than the distance between the parallel plate electrode and substrate.

(3) The apparatus for forming a deposited film according to (1) or (2), wherein energy for generating the plasma is high frequency power.

(4) The apparatus for forming a deposited film according to any of (1) to (3), wherein the deposited film is a silicon-based amorphous film.

(5) The apparatus for forming a deposited film according to any of (1) to (4), wherein the parallel plate electrode is connected, via a joint adjustable in height, to the power supply section for generating the plasma.

(6) The apparatus for forming a deposited film according to any of (1) to (5), wherein the substrate is a long, band-shaped one, the discharge vessel is composed of a plurality of discharge vessels connected in series to each other, the long, band-shaped substrate is continuously passed through the plurality of discharge vessels while moving the substrate in the longitudinal direction, and plasma is generated in the plurality of discharge vessels connected in series, whereby deposited films are continuously formed on a surface of the long substrate.

The exhaust port, exhaust tube and exhaust passage described in this specification are defined as follows:

The exhaust port is the inlet of the exhaust tube which faces the discharge space, and is surrounded by solid in a closed line (forming a circle or two or more lines, either straight or curved) as part of the external wall of the exhaust tube, wherein the line for the "solid in a line" is not a line of mathematical sense but used for helping understanding, and naturally has a certain thickness when the solid surrounds the exhaust port. The exhaust port serves as the end for the external exhaust tube wall, and the above solid naturally has a certain thickness in the longitudinal direction of the external exhaust tube wall. Members having slits or mesh members may be provided in the exhaust port. Cylinders and angular pillars are some of the examples of the solid member which surrounds the exhaust port. The exhaust tube continuously extends from the exhaust port to an exhaust means, e.g., vacuum pump, and basically forms the exhaust passage as a continuous closed space, wherein the term "basically" implies that another exhaust port or the like may be present for exhausting a space other than the discharge space. The exhaust tube may have a branch, valve or the like halfway, and exhaust passage may vary in sectional area. The exhaust pipe may vary in material halfway. The space merely surrounded by the external discharge vessel wall and inner vacuum vessel wall is not included in the exhaust passage. The space surrounded only by the inner discharge vessel wall or inner vacuum vessel wall is also not included in the exhaust passage. The structure with the substrate partly intruding in the exhaust port should be avoided, to enhance exhausting power.

DETAILED DESCRIPTION OF THE PREFERRED EMBODIMENTS

Figure 1:
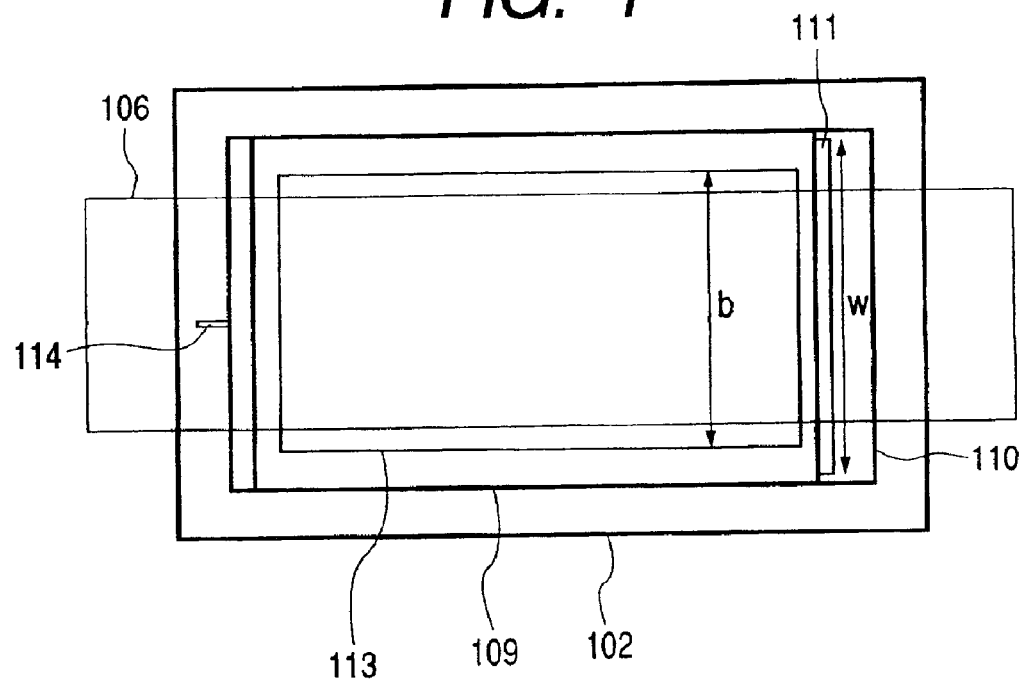
FIG. 1 presents a schematic top view of the discharge vessel for explaining one of the embodiments of the present invention, which includes the material gas exhaust duct with the material gas supply port whose section is wider than the parallel plate electrode and having a height longer than the distance between the parallel plate electrode and substrate.

As described above, the parallel plate electrode type plasma CVD apparatus, which forms the deposited film on the substrate by the aid of plasma generated in the deposited film forming space, includes the material gas exhaust duct with the material gas supply port whose section is wider than the parallel plate electrode and having a height longer than the distance between the parallel plate electrode and substrate. This structure reduces, when the gas is discharged, the viscous effect of the side wall of the vacuum vessel on the gas flow, and diminishes the stagnant region of the material gas during the deposited film forming process, bringing about the resultant advantages, e.g., increased uniformity of the film quality and thickness, and controlled formation of undesirable by-products, e.g., polysilane, which also should contribute to increased uniformity of the film quality and thickness, because these by-products may deteriorate the deposited film.

Therefore, the above structure can form functional deposited films, e.g., those for photoelectromotve devices, and greatly improve conversion efficiency.

Production of a solar cell with an amorphous silicon (hereinafter referred to as a-Si) layer is taken as one of the preferred embodiments in which the apparatus for forming a deposited film of the present invention is used, and explained by referring to the drawings.

Figure 2:
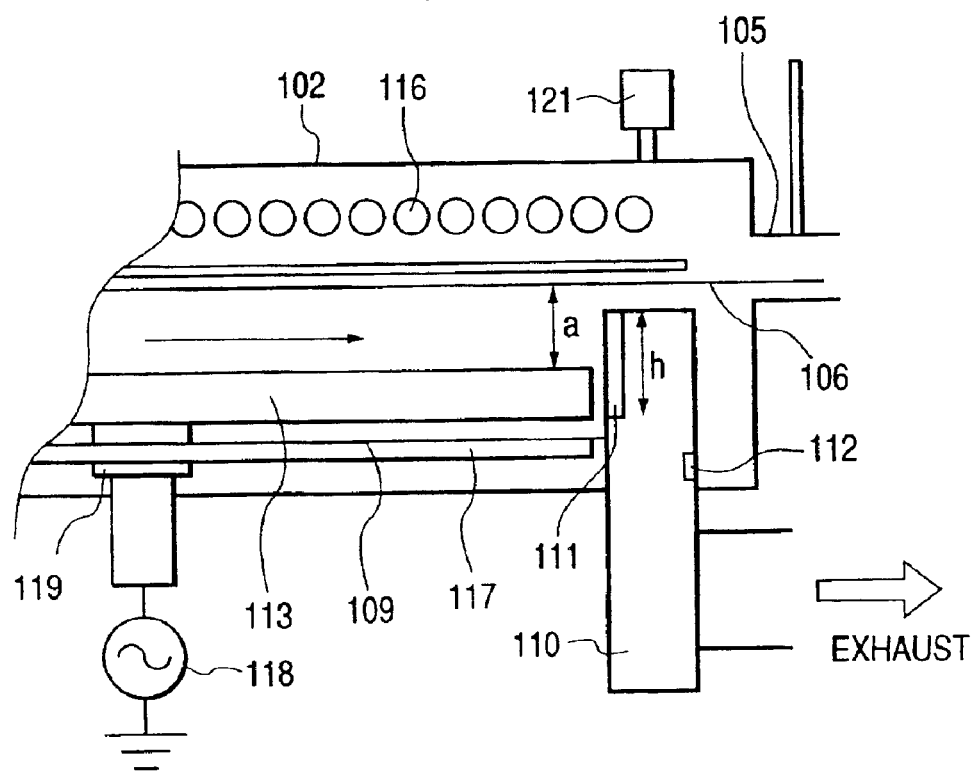
FIG. 2 is a schematic side view of the discharge vessel for explaining one of the embodiments of the present invention, which includes the material gas exhaust duct with the material gas supply port whose section is wider than the parallel plate electrode and having a height longer than the distance between the parallel plate electrode and substrate.
Figure 3:
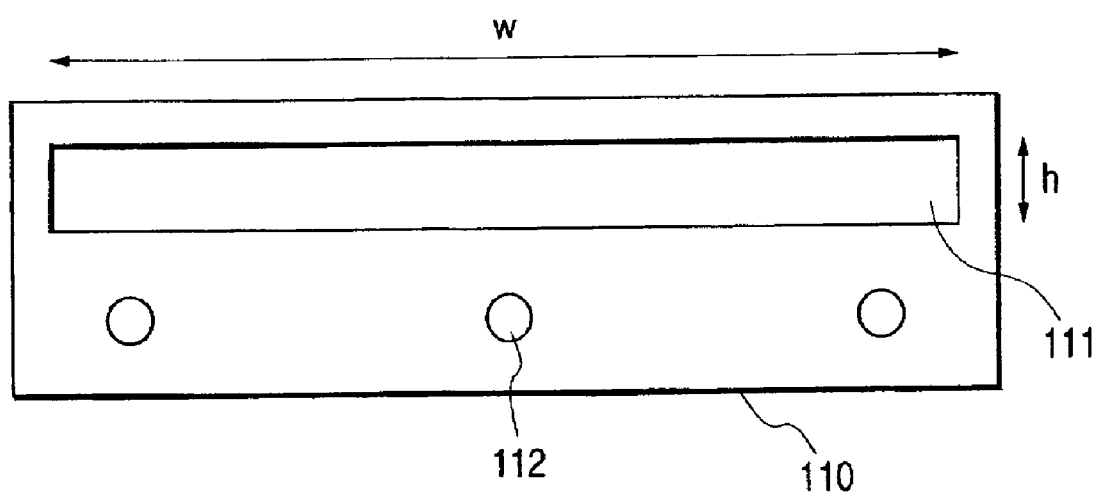
FIG. 3 outlines the exhaust duct used in an embodiment and example of the present invention.
Figure 4:
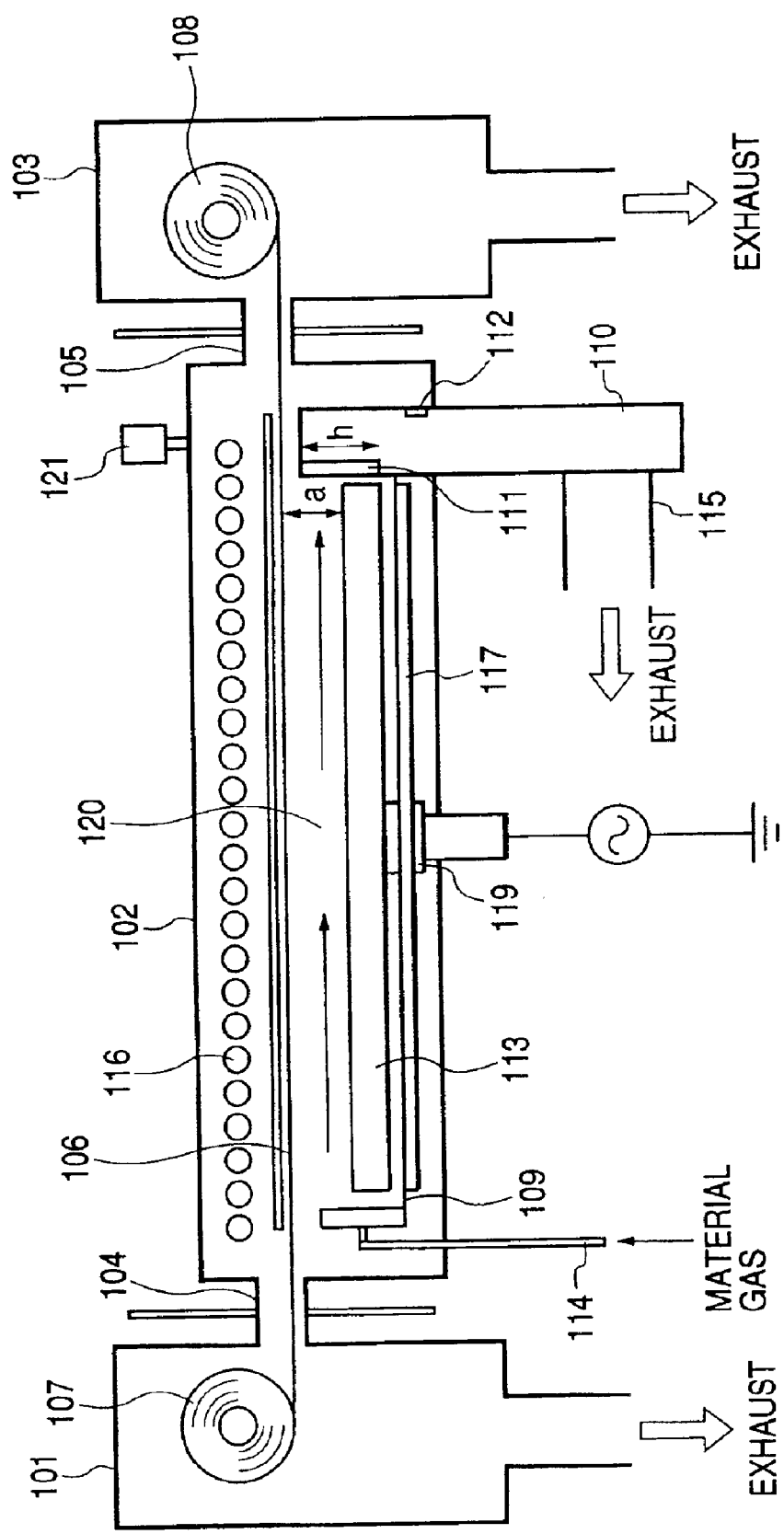
FIG. 4 schematically illustrates the roll-to-roll type plasma CVD apparatus used in an embodiment and example (experiment 1) of the present invention for preparation of the functional deposited film.

FIG. 4 outlines the section of the apparatus for forming a deposited film, used in the example of the present invention. FIGS. 1 and 2 magnify the vacuum vessel for the apparatus, and FIG. 3 the exhaust duct opening, where the arrow schematically represents the gas flow.

Three vacuum vessels 101, 102 and 103 are connected in series to each other via gas gates 104 and 105. The band-shaped substrate 106 is fed by the feeding roll 107, installed within the first vacuum vessel (feeding roll chamber) 101, to pass the first gas gate 104, second vacuum vessel 102 and second gas gate 105, in this order, and wound by the winding roll 108 installed within the third vacuum vessel (winding roll chamber) 103. The winding roll 108 is driven by driving means (not shown) to rotate in the arrowed direction, in order to continuously transfer the band-shaped substrate 106, fed by the feeding roll 107.

The inner vessel 109 installed within the vacuum vessel 102 is in the form of hollow rectangular parallelepiped with an opening on its one side, the opening being provided in such a way to come close to and face the band-shaped substrate 106. The inner vessel 109 includes the exhaust duct 110 to discharge the material gas, and the exhaust duct 110 includes the separate exhaust port (inner) 111 and exhaust port (outer) 112 for exhausting the inner vessel 109, the gas flowing into the exhaust duct 110 via the former and being released out of the exhaust duct 110 via the latter. The structure is characterized by the exhaust port (inner) 111 in the exhaust duct 110 being wider in the lateral direction (width in the lateral direction: W) than the parallel plate electrode 113 (width: (b)) and wider in the longitudinal direction (width in the longitudinal direction: (h)) than the distance (a) between the parallel plate electrode 113 and band-shaped substrate 106.

As shown in FIGS. 1 to 4, the material gas flows in the direction in parallel to the band-shaped substrate 106 transferring direction, passing over the parallel plate electrode 113 in the inner vessel 109, and is released into the exhaust duct 110. Noting flow of the material gas, the stagnant region of the material gas within the inner vessel 109 is diminished, on account of the exhaust port designs, with the exhaust port (inner) 111 being wider in the lateral direction than the parallel plate electrode 113 (W>(b)). This should make the deposited film more uniform both in quality and thickness, and, at the same time, control formation of undesirable by-products which may deteriorate the deposited film.

The stagnant region of the material gas within the inner vessel 109 is further diminished, on account of the exhaust port designs, with the exhaust port (inner) 111 being wider in the longitudinal direction than the distance between the parallel plate electrode 113 and band-shaped substrate 106 ((h)>(a)). This should make the deposited film still more uniform both in quality and thickness, and, at the same time, further control formation of undesirable by-products which may deteriorate the deposited film.

The material gas is supplied into the inner vessel 109 from a gas supply source (not shown), e.g., gas cylinder provided outside of the vacuum vessel 102, via the gas supply tube 114, which passes through the vacuum vessel 102 wall and is set in the inner vessel 109. Thus, the material gas is supplied into the inner vessel 109 via the gas supply tube 114, and released out of the apparatus via the exhaust duct 110 and then exhaust tube 115.

The gas supply tube 114 can supply, in addition to the material gas, a gas for heating the band-shaped substrate 106, and another gas for cleaning the vacuum vessel 102 and inner vessel 109 into the vacuum vessel 102. The vacuum vessel 102 also includes other devices, such as a group of lamp heaters 116 on the side facing the back side of the band-shaped substrate 106 (i.e., on the side not facing the inner vessel 109) to generate radiation heat for heating the band-shaped substrate 106; sheath heater 117 within the inner vessel 109 to heat the inner vessel 109; and parallel plate electrode 113 for generating the plasma discharge. The sheath heater 117 heats the inner vessel 109 and parallel plate electrode 113, to remove therefrom residual air or moisture adsorbed on them, and also to control formation of undesired by-products, e.g., polysilane.

The parallel plate electrode 113, which may be divided into several parts, faces the band-shaped substrate 106, running in parallel thereto. The parallel plate electrode 113 is electrically connected to one end of the rf power source 118, installed outside of the vacuum vessel 102, via a matching box (not shown) and the parallel plate electrode joint 119. The parallel plate electrode joint 119 comprises a height-adjustable member, e.g., screw type member, to securely connect the parallel plate electrode 113 to the power supply device. The rf power source 118 is grounded at the other end. The plasma discharge is generated in the space closed by the parallel plate electrode 113 and band-shaped substrate 106, when an rf power from the rf power source 118 is applied to the parallel plate electrode 113, after the vacuum vessel 102 is exhausted and the given material gas is supplied. The above closed space serves as the deposited film forming space 120. In other words, the deposited film forming space 120 corresponding to the inner vessel 109 is completed, to deposit the functional film on the band-shaped substrate 106.

Figure 5:
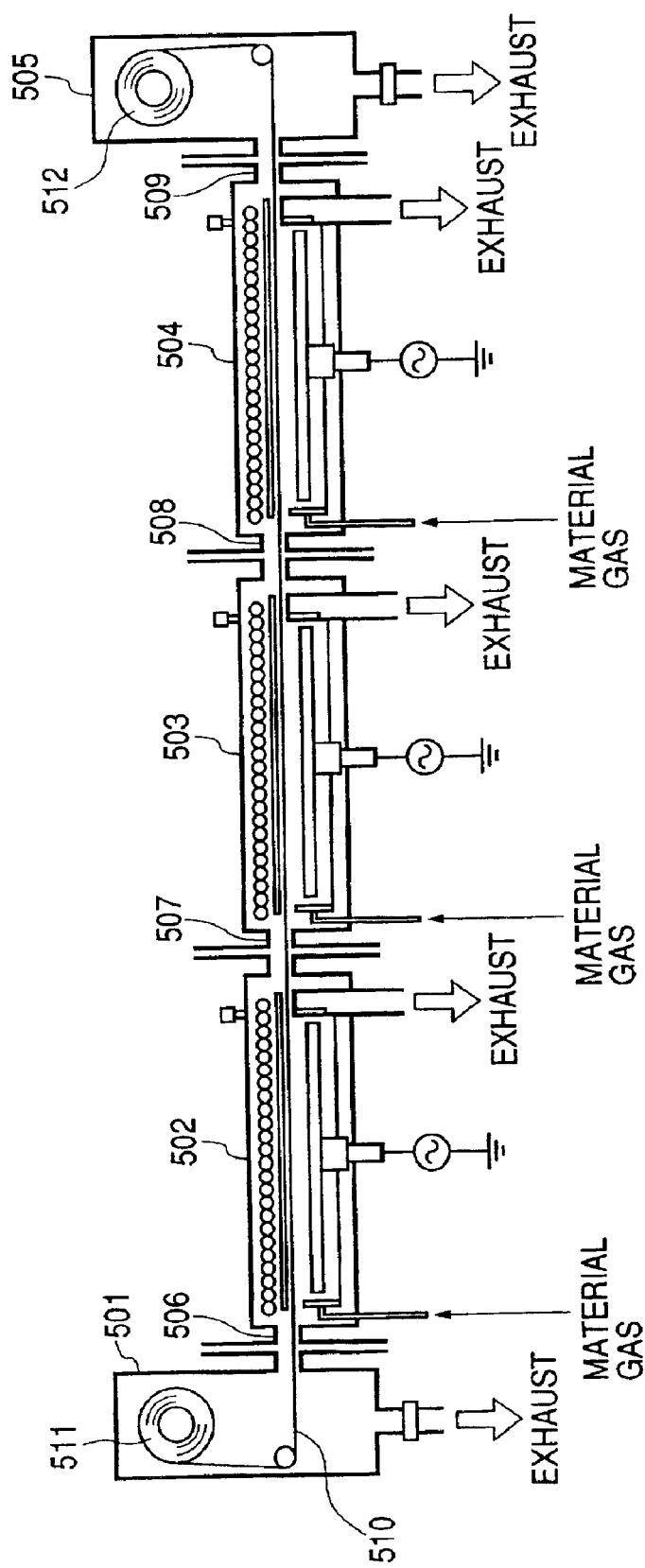
FIG. 5 schematically illustrates the roll-to-roll type plasma CVD apparatus used in an example (experiment 2) of the present invention for preparation of the single cells.

Next, the apparatus for forming a deposited film, which can easily produce a functional device, e.g., photoelectromotive device, is described. It is the above-described apparatus with the vacuum vessel 102 being further provided with vacuum vessels 102 on both sides for forming the deposited film. FIG. 5 outlines its section.

Five vacuum vessels 501 to 505 are connected in series to each other via gas gates 506 and 509. The band-shaped substrate 510 is fed by the feeding roll 511, installed within the first vacuum vessel (feeding roll chamber) 501, to pass the first gas gate 506, second vacuum vessel 502 and second gas gate 507, in this order, and wound by the winding roll 512 installed within the fifth vacuum vessel (winding roll chamber) 505. The winding roll 512 is driven by driving means (not shown) to rotate in the arrowed direction, in order to continuously transfer the band-shaped substrate 510, fed by the feeding roll 511. When an amorphous photoelectromotive device having pin junctions is to be formed on the band-shaped substrate 510, the second, third and fourth vacuum vessels 502, 503 and 504 serve as the film-making chambers for the n-, i- and p-type semiconductor layers, respectively. Thus, the apparatus for forming the photoelectromotive device is completed.

EXAMPLES

The present invention is described with reference to examples of the present invention, which by no means limit the present invention.

It is described by the experiments for forming the deposited films using the apparatus for forming a deposited film shown in FIG. 4 as one of the embodiments of the present invention, and the results are compared with those of comparative examples.

In the following examples, the thickness of the electrode was 5 mm, the width b in the lateral direction of the electrode was 504 mm, the width W of the exhaust port was 510 mm, the height h of the exhaust port was 100 mm, and the distance a between the electrode and the substrate was 50 mm.

Example 1

In the example 1, an amorphous silicon/germanium film was formed on the band-shaped substrate 106 using the apparatus for forming a deposited film shown in FIG. 4, to analyze the thickness and compositional distributions of the resultant deposited film. The substrate 106 was of stainless steel (SUS430BA, 12 cm wide, 50 m long and 0.2 mm thick), and a dry pump and mechanical booster pump were used as the exhaust pump system for the vacuum vessel 101.

First, the feeding roll chamber 101 containing the feeding roll 107, winding roll chamber 103 containing the winding roll 108 and vacuum vessel 102 were preliminary exhausted by the dry pump (not shown) and then further exhausted to around $10^{-3}$ Torr by the mechanical booster pump (also not shown). He gas was introduced as the purge gas into the vacuum vessel 102 through the gas supply tube 114 from a gas cylinder (not shown) via a mass flow controller (not shown), and a butterfly valve (not shown) in each of the exhaust tubes 115 was adjusted to keep pressure at 1.0 Torr, read by the vacuum meter 121. The band-shaped substrate 106 was heated by the lamp heater 116 at a given level on the surface, and the gas was charged and discharged for 10 hours while it was heated at a given level by the sheath heater 117.

$SiH_4$, $GeH_4$ and $H_2$ gases as the stock gases were charged through the gas supply tube 114 from the gas cylinders (not shown) via the mass flow controllers (also not shown) under the i-type film forming conditions, given in Table 1, and the butterfly valve (not shown) in each of the exhaust tubes was adjusted to keep pressure at 1.0 Torr, read by each of the vacuum meters 121. First, the above material gases were charged, and an RF power of 13.56 MHz, having an effective RE power shown in Table 1, was applied by the RE power source 118 to the parallel plate electrode 113 for each layer type, while these gases were being charged, to generate the plasma discharge in the deposited film forming space 120, and thereby to deposit the film over a length of 40 m on the band-shaped substrate 106. The band-shaped substrate 106 was transferred at 15 cm/minute.

TABLE 1

| Substrate | SUS430 (350 mm wide × 300 m long × 0.2 mm thick) | | | |
|---|---|---|---|---|
| Reflection layer | Thin aluminum (Al) film: 0.2 μm thick | | | |
| Reflection acceleration layer | Zinc oxide (ZnO): 1.2 μm thick $H_{S10}OO$ (sccm) | | | |
| Gate gas Names of layers | Material gases and their rates (sccm) | Pressure (Torr) | Effective power (W) | Heating temperature (0° C.) |
| Conditions under which each layer was prepared | n-type layer | $SiH_4$: 220 $PH_3/H_2(2\%)$: 330 $H_2$: 3000 | 1.0 | RF power: 250 | 320 |
| | i-type layer | $SiH_4$: 120 × 2 $GeH_4$: 100 × 2 $H_2$: 600 × 2 | 1.05 | RF power: 350 | 250 |
| | p-type layer | $SiH_4$: 30 $BF_3/H_2(2\%)$ $H_2$: 5000 | 0.01 | RF power: 1800 | 220 |
| Transparent electrode | Thin ITO ($In_2O_3$ + $SnO_2$) film, 70 nm thick | | | |
| Current-collecting electrode | Thin aluminum (Al) film, 2 μm thick | | | |

After the film was deposited and cooled, the film-coated, band-shaped substrate 106 was withdrawn, to analyze the film thickness distribution in the width direction by a film thickness meter (Alpha Step 100 manufactured by Tokyo Electron Limited,). The film thickness dispersion was 2.5% or less, and the deposition rate was estimated at 8 Å/second on the average. A total of 10 samples were cut off arbitrarily from the film-coated substrate 106, and analyzed for film composition in the thickness direction by a secondary ion mass analyzer (SIMS, CAMECA, imf 3f). The germanium content distribution was within ±3% at an arbitrarily selected depth for the 10 samples.

No by-products, e.g., polysilane, were observed, after the film-making process was over, in the film-forming space or around the exhaust port, indicating that formation of undesirable by-products possibly deteriorating the deposited film was controlled.

Comparative Example 1

In the comparative example 1, the film was deposited on the substrate in the same manner as in the example 1, except that the exhaust port (inner) 111 opening was narrower in the lateral direction than the parallel plate electrode 113 (W=450 mm, W<b), and also narrower in the longitudinal direction than the distance between the parallel plate electrode 113 and band-shaped substrate 106 (h=30 mm, h<a). The film thickness distribution was analyzed in the same manner as in the example 1. The film thickness dispersion was ±7.0%, and the germanium content distribution was ±6% at an arbitrarily selected depth.

Moreover, it was observed that polysilane was deposited in the film-forming space and around the exhaust port.

It is found, when the results of the example 1 are compared with those of the comparative example 1, that the apparatus of the present invention for forming a deposited film can diminish the stagnant region of the material gas in the film-forming space, to control formation of undesirable by-products, e.g., polysilane, which may deteriorate the deposited film, and, at the same time, to deposit the film uniform both in quality and thickness.

Example 2

In the example 2, a pin type single cell was formed on the band-shaped substrate using the apparatus for forming a deposited film shown in FIG. 5, to analyze its characteristics. It was a roll-to-roll type plasma CVD apparatus having the vacuum vessel (102 in the apparatus used in the example 1) which was further provided with vacuum vessels connected in cascade, so that it could form the pin type single cell on the band-shaped substrate.

First, each of the vacuum vessels 501 to 505 was exhausted by an exhaust pump (not shown), and the gate gas was charged while the exhaust pump was working, via each of the gate gas supply tubes 506 to 509 into each of the vacuum vessels 501 to 505, in order to prevent the material gas in each of the vacuum vessels from flowing into the adjacent vacuum vessel. Then, the winding roll 512 was rotated by driving means (not shown) to continuously transfer the band-shaped substrate 510 in the longitudinal direction, while the given material gas was charged into each of the vacuum vessels 502 to 504. The film could be deposited on the band-shaped substrate 510 by generating a plasma discharge in these vacuum vessels 502 to 504 under the above conditions. The band-shaped substrate 510 was continuously transferred from the first vacuum vessel 501 toward the fifth vacuum vessel 505, and coated with the films orderly in the second, third and fourth vacuum vessels 502, 503 and 504. The band-shaped substrate 510 used for this experiment was of stainless steel (SUS430) coated with thin films of evaporated aluminum (0.2 μm thick) and ZnO (1.2 μm thick) by sputtering, in consideration that it was to be used as the lower electrode.

The band-shaped substrate 510 was continuously transferred at 15 cm/minute, to be coated with the n-type semiconductor layer in the second vacuum vessel 502, i-type semiconductor layer in the third vacuum vessel 503 and p-type semiconductor layer in the fourth vacuum vessel 504, in this order, under the same conditions as in the example 1 (including those for depositing the i-type semiconductor layer, shown in Table 1), except that the n- and p-type semiconductor layers were deposited under the conditions shown in Table 2. The resultant amorphous silicon type solar cell was irradiated with artificial solar ray having an AM value of 1.5 and light intensity of 100 mW/cm². The photoelectric conversion efficiency was measured for the solar cell at 40 arbitrarily selected points. Its dispersion was within ±4%.

Comparative Example 2

In the comparative example 2, the amorphous silicon type solar cell was formed on the substrate in the same manner as in the example 2, except that the exhaust port (inner) 111 opening was narrower in the lateral direction than the parallel plate electrode 113 (W<(b)), and also narrower in the longitudinal direction than the distance between the parallel plate electrode 113 and band-shaped substrate 106 ((h)<(a)). The solar cell was measured for the photoelectric conversion efficiency at 40 arbitrarily selected points in the same manner as in the example 2, with artificial solar ray having an AM value of 1.5 and light intensity of 100 mW/cm². Its dispersion was ±10% or more.

It is found, when the results of the example 2 are compared with those of the comparative example 2, that the apparatus of the present invention can diminish the stagnant region of the material gas in the film-forming space, while the band-shaped substrate 510 is coated with films in the second to fourth vacuum vessels 502 to 504, to deposit the films uniform both in quality and thickness, and, at the same time, to control formation of undesirable by-products, e.g., polysilane, which may deteriorate the deposited film. Therefore, it is confirmed that the apparatus of the present invention, when applied to production of an amorphous photoelectromotive device with pin junctions, can give an excellent amorphous photoelectromotive device with each semiconductor layer uniform both in film quality and thickness over a wide area.

As described above, the apparatus of the present invention can discharge the material gas, while reducing the viscous effect of the side wall of the vacuum vessel on the gas flow, on account of the exhaust port designs in the discharge vessel in the vacuum vessel, with the exhaust port (inner) being wider in the lateral direction than the parallel plate electrode 113 and also wider in the longitudinal direction than the distance between the parallel plate electrode and band-shaped substrate. This diminishes the stagnant region of the material gas during the deposited film forming process, bringing about the resultant advantages, e.g., increased uniformity of the film quality and thickness, and controlled formation of undesirable by-products, e.g., polysilane, which also should contribute to increased uniformity of the film quality and thickness, because these by-products may deteriorate the deposited film. Therefore, the apparatus of the present invention for forming a deposited film can greatly improve conversion efficiency, particularly when applied to deposition of the functional films, e.g., those for photoelectromotive devices.

What is claimed is:

1. An apparatus for forming a deposited film, comprising a discharge vessel in a vacuum vessel, the discharge vessel comprising a parallel flat plate electrode, material gas supply means and material gas exhaust means, having opposing walls at least one of which (i) comprises a substrate on which the film is deposited and is (ii) located in opposition to the parallel flat plate electrode to form a plasma-generating space therebetween, wherein the material gas is introduced into the discharge vessel while exhausting an interior of the discharge vessel and plasma is generated in the space between the parallel flat electrode and the substrate in the discharge vessel, thereby decomposing the material gas to form the deposited film on the substrate, wherein the width of an exhaust port of the material gas exhaust means perpendicular to the longitudinal direction of the substrate is wider than the width of the parallel plate electrode perpendicular to the longitudinal direction of the substrate and the exhaust port faces the space bounded by the parallel plate electrode and the substrate.

2. The apparatus for forming a deposited film according to claim 1, wherein a length of the opening in a longitudinal direction perpendicular to the lateral direction is longer than a distance between the parallel flat electrode and the substrate.

3. The apparatus for forming a deposited film according to claim 1, wherein energy for generating the plasma is high frequency power.

4. The apparatus for forming a deposited film according to claim 1, wherein the deposited film is a silicon-based amorphous film.

5. The apparatus for forming a deposited film according to claim 1, wherein the parallel flat plate electrode is connected, via a joint adjustable in height, to a power supply section for generating the plasma.

6. The apparatus for forming a deposited film according to claim 1, wherein the substrate is long and band-shaped, the discharge vessel is composed of a plurality of discharge vessels connected in series to each other, the long and band-shaped substrate is continuously passed through the plurality of discharge vessels while moving the substrate in a longitudinal direction, and plasma is generated in the plurality of discharge vessels connected in series, whereby deposited films are continuously formed on a surface of the long and band-shaped substrate.

7. The apparatus for forming a deposited film according to claim 1, wherein no portion of the substrate extends into the exhaust port.

\* \* \* \* \*